US012684896B2

(12) United States Patent
Fulk et al.

(10) Patent No.: US 12,684,896 B2
(45) Date of Patent: Jul. 14, 2026

(54) LOW-STRESS DIELECTRIC LAYER, PLANARIZATION METHOD, AND LOW-TEMPERATURE PROCESSING FOR 3D-INTEGRATED ELECTRICAL DEVICE

(71) Applicant: Raytheon Company, Waltham, MA (US)

(72) Inventors: Chad Fulk, Goleta, CA (US); Sean P. Kilcoyne, Lompoc, CA (US); Stuart Farrell, Goleta, CA (US); Eric Miller, Lompoc, CA (US); Andrew Clarke, Goleta, CA (US)

(73) Assignee: Raytheon Company, Arlington, VA (US)

( * ) Notice: Subject to any disclaimer, the term of this patent is extended or adjusted under 35 U.S.C. 154(b) by 606 days.

(21) Appl. No.: 17/361,859

(22) Filed: Jun. 29, 2021

(65) Prior Publication Data

US 2022/0416095 A1 Dec. 29, 2022

(51) Int. Cl.
| | |
|---|---|
| *H10F 77/00* | (2025.01) |
| *H10F 30/221* | (2025.01) |
| *H10F 71/00* | (2025.01) |
| *H10P 14/692* | (2026.01) |
| *H10P 14/694* | (2026.01) |
| *H10W 20/00* | (2026.01) |

(52) U.S. Cl.
CPC ....... *H10F 77/933* (2025.01); *H10F 30/2212* (2025.01); *H10F 71/1253* (2025.01);
(Continued)

(58) Field of Classification Search
CPC ........... H01L 31/02005; H01L 21/0217; H01L 21/02178; H01L 21/76831; H01L 31/1032;
(Continued)

(56) References Cited

U.S. PATENT DOCUMENTS

| | | | |
|---|---|---|---|
| 4,783,594 | A | 11/1988 | Schulte et al. |
| 5,365,088 | A | 11/1994 | Myrosznyk |
| | | (Continued) | |

FOREIGN PATENT DOCUMENTS

| | | |
|---|---|---|
| CN | 101728403 A | 6/2010 |
| CN | 105870097 A | 8/2016 |
| | (Continued) | |

OTHER PUBLICATIONS

"Coefficient of Thermal Expansion, CTE Mismatch: Indium and Indium alloys;" Indium Corporation; www.indium.com/blog/coefficient-of-thermal-expansion-cte-mismatch-indium-and-indium-alloys.php (2009) (Year: 2009).*
(Continued)

*Primary Examiner* — Davienne N Monbleau
*Assistant Examiner* — John Patrick Cornely

(57) ABSTRACT

An electrical device includes a substrate, a dielectric layer supported by the substrate, and an electrically conductive vertical interconnect extending through the dielectric layer. The dielectric layer may be formed at low-temperature below the thermal degradation temperature of thermally-sensitive material in the device. The dielectric layer may be a low-stress layer that imparts no stress or less stress than a failure stress of fragile material in the device. The dielectric layer may be formed during a processing step to planarize the electrical device at that step. The vertical interconnect may be diffusion bondable with another opposing interconnect at a low-temperature below the thermal degradation temperature of thermally-sensitive material in the device. The vertical interconnect may have a coefficient of thermal expansion (CTE) that is greater than a CTE of the dielectric layer to facilitate 3D-integration.

20 Claims, 7 Drawing Sheets

(52) U.S. Cl.
  CPC .. *H10P 14/69391* (2026.01); *H10P 14/69433*
              (2026.01); *H10W 20/076* (2026.01)
(58) Field of Classification Search
  CPC .......... H01L 31/1832; H01L 27/14636; H01L
                        31/0224; H01L 31/09
  See application file for complete search history.

(56)                    References Cited

U.S. PATENT DOCUMENTS

| | | | | |
|---|---|---|---|---|
| 5,401,986 | A | * | 3/1995 | Cockrum .............. H01L 21/471 |
| | | | | 257/466 |
| 6,127,203 | A | | 10/2000 | Wan et al. |
| 10,418,406 | B2 | | 9/2019 | Kilcoyne et al. |
| 2015/0319390 | A1 | | 11/2015 | Sanchez et al. |
| 2018/0269172 | A1 | * | 9/2018 | Katkar .................... H01L 24/08 |
| 2021/0118934 | A1 | | 4/2021 | Zandian |

FOREIGN PATENT DOCUMENTS

| | | | | |
|---|---|---|---|---|
| CN | 111554761 | A | | 8/2020 |
| EP | 0635885 | A1 | * | 1/1995 ........... H01L 23/481 |
| JP | 3412952 | B2 | | 6/2003 |
| JP | 2019512890 | A | | 5/2019 |
| WO | 2021178031 | A1 | | 9/2021 |

OTHER PUBLICATIONS

Chuen-Lin Tien and Tsai-Wei Lin, "Thermal expansion coefficient and thermomechanical properties of SiNx thin films prepared by plasma-enhanced chemical vapor deposition," Appl. Opt. 51, 7229-7235 (2012) (Year: 2012).*

"What is Coefficient of Thermal Expansion (CTE)? How Do I Measure It?," Thermal Analysis Labs; https://ctherm.com/resources/newsroom/blog/coefficient-of-thermal-expansion/#:~:text=ln (Jul. 29, 2018). (Year: 2018).*

"Aluminum Nitride, AlN Ceramic Properties," Accuratus Corporation; https//accuratus.com/alumni.html (2013). (Year: 2013).*

Seung-Min Chung, Young-Ho Kim, "Fine Pitch and Low Temperature Bonding Using Solder Bumps and the Assessment of Solder Joint Reliability," Materials Transactions, 2007, vol. 48, Issue 1, pp. 37-43, Released on J-Stage Dec. 25, 2006, Online ISSN 1347-5320, Print ISSN 1345-9678. (Year: 2007).*

"Advantages and disadvantages of integrated circuits;" Jotrin Electronics Limited; www.jotrin.com/technology/details/advantages-and-disadvantages-of-integrated-circuits; May 27, 2020. (Year: 2020).*

Butcher K S A et al: "Predeposition ultraviolet treatment for adhesion improvement of thin films on mercury cadmium telluride", Journal of Vacuum Science, American Institute of Physics, vol. 19, No. 1, Jan. 1, 2001.

International Search Report and Written Opinion mailed Sep. 29, 2022 in Corresponding International Application No. PCT/2022/026698.

Invitation to Pay Additional Fees mailed Aug. 8, 2022 in corresponding International Application No. PCT/US2022/026698.

Rogalski, "Review: Hg1-xMnxTa As a New Infrared Detector Material," Infrared Phys., vol. 31, No. 2, pp. 117-166 (1991).

Office Action issued Dec. 24, 2024 in connection with Japanese Patent Application No. 2023-578902, 40 pages.

Yamadera, "Measurement and Control of Thermal Stress in Thin Films," RD Review of Toyota CRDL, vol. 34, No. 1, Mar. 1999, 12 pages.

Notice of Allowance dated Mar. 11, 2025 in connection with Japanese Patent Application No. 2023-578902, 5 pages.

\* cited by examiner

100

100

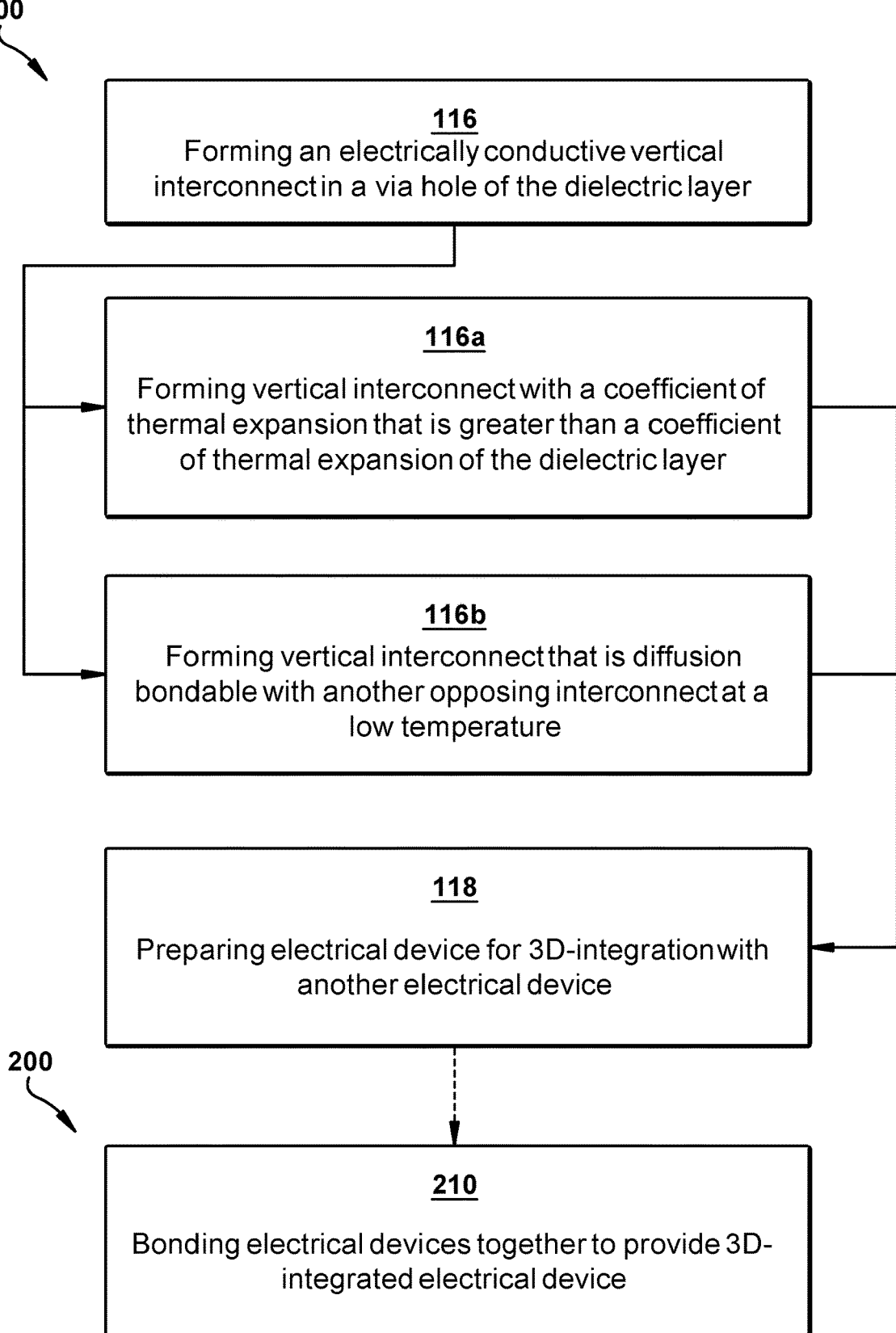

116
Forming an electrically conductive vertical interconnect in a via hole of the dielectric layer

116a
Forming vertical interconnect with a coefficient of thermal expansion that is greater than a coefficient of thermal expansion of the dielectric layer

116b
Forming vertical interconnect that is diffusion bondable with another opposing interconnect at a low temperature

118
Preparing electrical device for 3D-integration with another electrical device

200

210
Bonding electrical devices together to provide 3D-integrated electrical device

Fig. 1B

LOW-STRESS DIELECTRIC LAYER, PLANARIZATION METHOD, AND LOW-TEMPERATURE PROCESSING FOR 3D-INTEGRATED ELECTRICAL DEVICE

TECHNICAL FIELD

The present invention relates generally to semiconductor devices, and more particularly to a semiconductor device with a low-stress dielectric layer, planarization method, and/or low-temperature processing conditions, such as for use in low-temperature 3D-integration.

BACKGROUND

Electrical devices, such as semiconductor integrated circuits (ICs) or other semiconductor devices, are typically fabricated into and/or on a substrate, such as a silicon wafer, resulting in an IC area that generally increases in size and density as the complexity of the IC increases. One trend in recent IC fabrication has been to increase the number and/or different types of ICs by vertically stacking and vertically interconnecting the ICs together. Generally, each of the vertically stacked ICs can be of different sizes, come from different size wafers, have different functions, be made of different materials, etc.

Some conventional methods for realizing the approach of vertically stacking and integrating ICs is through a direct bond or hybrid bond process. Commonly, after a desired number of individual ICs have been vertically stacked, the stacked electrical device assembly undergoes a temperature treatment to cause diffusion between structure(s) of the opposing ICs resulting in a 3D-integrated electrical device structure with an electrical connection across the stacked ICs.

SUMMARY

One problem with some semiconductor devices, such as photodetectors for example, is that temperature-sensitive materials may be required in the utilization of such devices, which makes these devices susceptible to the processing conditions leading up to and during 3D-integration. As an example, photodetectors for sensing infrared light may utilize temperature-sensitive photoconductor materials such as $Hg_{1-x} Cd_x Te$ (commonly referred to as "MCT"). The thermal degradation temperature of MCT at which properties of the material are deleteriously affected is at about 150° C.

Another problem with some electrical devices is that they may incorporate fragile materials into their architecture, for example materials with low fracture toughness, in which tensile forces imparted on the fragile material will cause damage and/or interrupt proper operation of the material. MCT is an example of a fragile material that is susceptible to damage (e.g., defects, crack propagation, and/or interface failure) and/or electrical interruption (e.g., piezoelectric response) when experiencing a relatively small amount of tensile strain.

To facilitate fabrication of such electrical devices, it would be beneficial to apply a low-stress dielectric layer at low temperatures to prevent degradation of materials such as MCT within the electrical device.

For example, the low-stress dielectric layer may be applied to the electrical device at a temperature of less than about 150° C. to prevent degradation of MCT.

The low-stress dielectric layer may be configured to impart little to no stress on the fragile material(s) within the device to prevent degradation thereof.

For example, the low-stress dielectric layer may impart a stress, if any, that is less than a yield, ultimate tensile, or fracture strength of the fragile material. For example, the $K_{IC}$ fracture toughness of MCT may be about 0.20 $MPa·m^{1/2}$ by Vickers indentation testing. Thus, where MCT is used in the electrical device, for example, the low-stress dielectric layer may impart a tensile stress, if any, to the MCT layer that is less than the MCT tensile strength. In exemplary embodiments, for example the low-stress dielectric layer may have an intrinsic in-plane biaxial stress that is in a range from 0.0 MPa to 3.5 MPa, for example.

Yet another problem with the fabrication of electrical devices such as photodetectors is that deposition of materials such as MCT may result in a latent total thickness variation that may require additional process steps to remove, or which may make it more difficult for 3D-integration with another electrical device.

Accordingly, the low-stress dielectric layer may be deposited during fabrication of the electrical device to provide planarization of the dielectric to compensate for the latent total thickness variation in an underlayer of the device.

To enable 3D-integration of the electrical device, one or more electrically conductive vertical interconnect structures may be formed in respective via holes of the low-stress dielectric layer. To facilitate 3D-integration at low temperatures to avoid degradation of the thermally-sensitive materials, such as MCT, the vertical interconnect(s) may be configured to be diffusion bondable to another opposing interconnect at low temperatures. In addition, the vertical interconnect(s) may be configured to cooperate with the low-stress dielectric layer to enable such diffusion bonding between interconnect structures.

According to an aspect, an electrical device includes: a substrate; a low-stress dielectric layer supported by the substrate, wherein the low-stress dielectric layer has at least one via hole; and an electrically conductive vertical interconnect disposed in the via hole; wherein the electrically conductive vertical interconnect is diffusion bondable to another opposing interconnect at a temperature of 150° C. or less; and wherein the electrically conductive vertical interconnect has a coefficient of thermal expansion that is greater than a coefficient of thermal expansion of the low-stress dielectric layer.

According to another aspect, a method of fabricating an electrical device, includes: forming a dielectric layer overlying at least a portion of a substrate; forming a via hole in the dielectric layer; and forming an electrically conductive vertical interconnect in the via hole; wherein at a time of the forming the dielectric layer, the electrical device includes a thermally-sensitive material having a thermal degradation temperature in a range from 100° C. to 200° C.; and wherein the forming the dielectric layer is performed at a temperature equal to or less than the thermal degradation temperature of the thermally-sensitive material.

According to another aspect, a method of fabricating an electrical device, includes: depositing a photoconductive material layer overlying at least a portion of a substrate; and depositing a dielectric material to planarize an upper surface of the electrical device to compensate for a latent total thickness variation in the photoconductive material layer.

The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

FIG. 1B is a flow chart continuing from the method in FIG. 1A and also showing an exemplary step of 3D-integrating the electrical device.

DETAILED DESCRIPTION

Figure 1A:
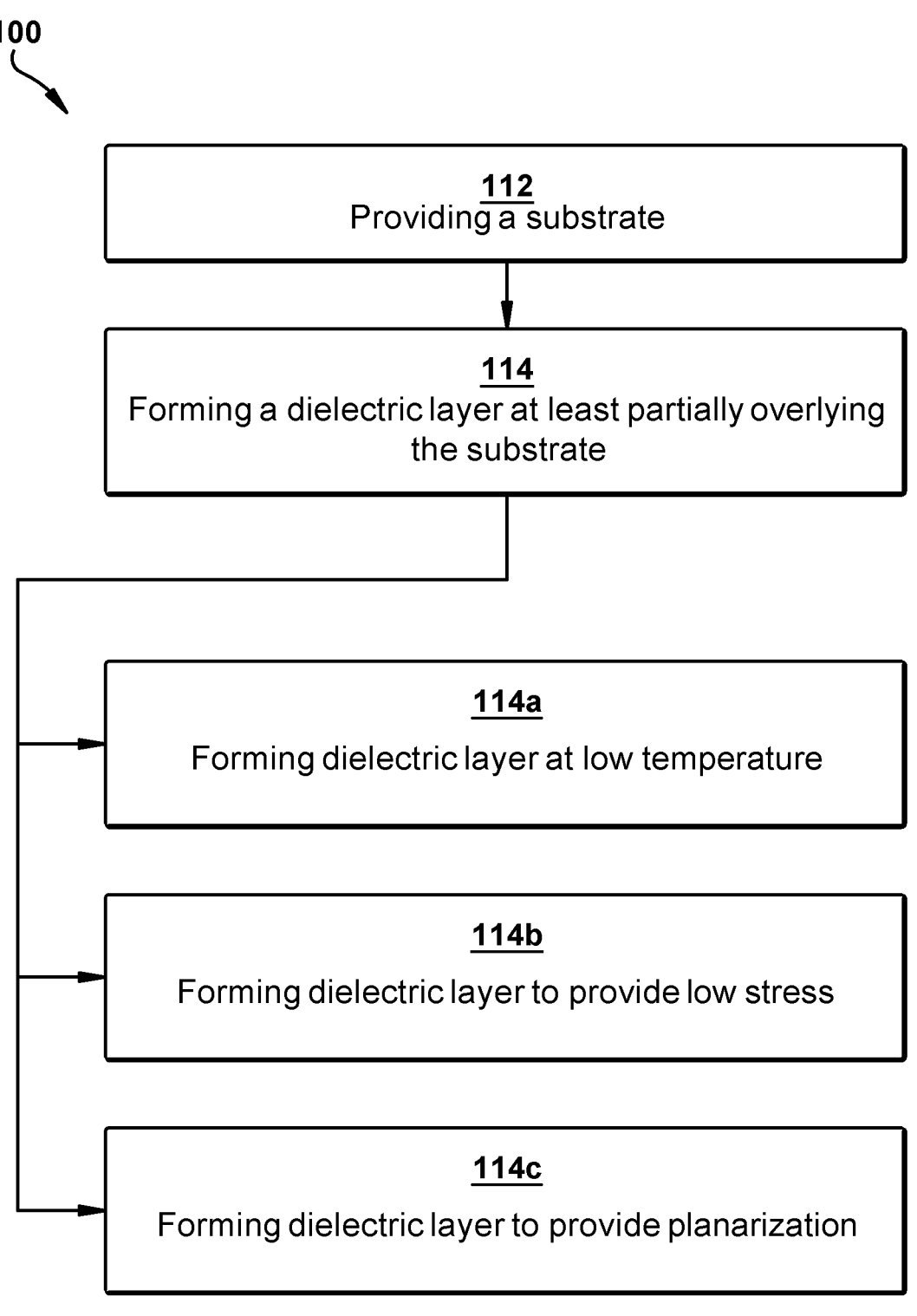
FIG. 1A is a flow chart showing at least a portion of an exemplary method of fabricating an exemplary electrical device according to an embodiment.

The principles and aspects according to the present disclosure have particular application to electrical devices, such as integrated circuit (IC) devices, and more particularly vertically integrated semiconductor integrated circuit (IC) devices, including application specific integrated circuits (ASICs), focal plane arrays and intelligent image sensors, memory chips, monolithic microwave integrated circuits (MMICs), infrared electrical devices (e.g., infrared detectors), antenna circuits, stripline, distribution networks, etc., and will be described below chiefly in this context. It is understood, however, that the principles and aspects according to the present disclosure may be applicable to other electrical devices, or electrical circuits in general, where it is desirable to provide an aluminum nitride tensile layer for balancing forces and thereby controlling the amount of bow in such devices. Non-limiting examples of such electrical devices may include non-semiconductor devices, such as passive radio frequency (RF) circuits (for example, filters or antenna arrays), or other semiconductor devices, such as diodes, photocells, transistors, sensors, and the like. The exemplary method of forming the exemplary electrical device may also be applicable to vertically integrating both active and passive electrical devices.

As discussed above, a problem with some conventional electrical devices is that temperature-sensitive materials in the device may be susceptible to processing conditions at elevated temperatures. Another problem with some conventional electrical devices is that they may incorporate fragile materials into their architecture, in which excessive forces imparted on the fragile material will cause damage and/or interrupt proper operation of the material. Still another problem with some conventional electrical devices, is that deposition of some materials in the device may result in a latent total thickness variation that may require additional process steps to remove, or which may make it more difficult for 3D-integration with another electrical device.

One particular type of electrical device that experiences one or more of the foregoing problems is a photodetector that employs MCT ($Hg_{1-x}Cd_xTe$) as a photoconductor layer of the device. MCT is a thermally-sensitive material having a thermal degradation temperature of about 150° C. MCT also is an example of a fragile material that is susceptible to damage (e.g., defects, crack propagation, and/or interface failure) and/or electrical interruption (e.g., piezoelectric response) when experiencing a relatively small amount of tensile strain. For example, the $K_{IC}$ fracture toughness of MCT may be about 0.20 MPa·m$^{1/2}$ by Vickers indentation testing. In addition, deposited MCT is susceptible to latent total thickness variations that may need to be accounted for during fabrication to provide suitability for 3D-integration, for example.

Accordingly, an exemplary electrical device is described herein that solves one or more of the foregoing problems with conventional electrical device designs, and more particularly solves one or more problems associated with photodetectors that utilize MCT. In exemplary embodiments, an insulating dielectric layer of the device is deposited at a temperature of less than about 150° C. to prevent degradation of temperature sensitive materials such as MCT. Alternatively or additionally, in exemplary embodiments the dielectric material is applied to provide a low-stress layer that imparts little to no stress on the fragile material(s) in the device, such as MCT. Alternatively or additionally, in exemplary embodiments the dielectric layer is applied during fabrication to provide planarization of the dielectric to compensate for latent total thickness variation in an underlayer of the device, such as an MCT photoconductor layer.

The exemplary electrical device described herein may be particularly suitable for 3D-integration with another electrical device, such as a read-out integrated circuit (ROIC), for example. Accordingly, to enable such 3D-integration, the exemplary electrical device includes one or more electrically conductive vertical interconnect structures at least partially surrounded by the exemplary dielectric layer. In exemplary embodiments, to facilitate 3D-integration at low temperatures to avoid degradation of thermally-sensitive materials, such as MCT, the vertical interconnect(s) may be configured to be diffusion bondable to another opposing interconnect at low temperatures, such as a temperature lower than a degradation temperature of MCT. Alternatively or additionally, in exemplary embodiments the vertical interconnect(s) are configured to cooperate with the low-stress dielectric layer to enable such diffusion bonding between interconnect structures, such as by providing a coefficient of thermal expansion of the interconnect(s) that is greater than a coefficient of thermal expansion of the exemplary dielectric material.

FIG. 1A depicts an exemplary method 100 for forming an exemplary electrical device, such as a photodetector semiconductor device, according to an embodiment. As shown, FIG. 1A generally includes the steps of: providing a substrate of the electrical device (step 112), and forming a dielectric layer at least partially overlying the substrate (step 114); wherein the forming step 114 may include one or more of: (i) forming the dielectric layer at a low temperature (step 114a), such as a temperature at or lower than a degradation temperature of one or more thermally-sensitive materials in the electrical device; (ii) forming the dielectric layer to provide a low stress state (step 114b), such as providing no stress or a lower stress than a failure stress (e.g., ultimate tensile, fracture, yield strength) of one or more fragile materials in the electrical device; and/or (iii) forming the dielectric layer to provide planarization of the electrical device (step 114c), such as to reduce or eliminate latent total thickness variation in one or more layers underlying the dielectric layer of the device.

FIG. 1B is a continuation of the method 100 shown in FIG. 1A according to an embodiment. As shown, FIG. 1B generally includes the steps of: forming at least one electrically conductive vertical interconnect in a via hole of the dielectric layer (step 116); wherein the forming step 116 may include one or more of: (i) forming the vertical interconnect(s) with a coefficient of thermal expansion that is greater than a coefficient of thermal expansion of the dielectric layer (step 116a); and (ii) forming the vertical interconnect(s) that is diffusion bondable with another opposing interconnect at a low temperature (step 116b). As shown, the exemplary method 100 may continue with preparing the electrical device (first electrical device) for 3D-integration with another electrical device (second electrical device). Also as shown in FIG. 2, following the method of fabricating the first exemplary electrical device, a method 200 including a step 210 of bonding the first and second electrical devices together to provide a 3D-integrated electrical device may be provided according to exemplary embodiments.

FIGS. 2A-2G are schematic cross-sectional views depicting exemplary process steps for forming an exemplary electrical device 10 according to the method 100. In the illustrated embodiment, the semiconductor device 10 is a photodetector 10 that generally includes a substrate 12, a photoconductor layer 14 supported by the substrate 12, an exemplary low-stress dielectric layer 16 overlying at least portion (e.g., major surface) of the substrate 12, and one or more electrically conductive vertical interconnects 18 within respective via holes of the low-stress dielectric layer 16. It is understood that the depiction of the photoconductor 10 is exemplary, and any suitable form of electrical device may be used in accordance with the principles and aspects disclosed herein.

Figure 2A:
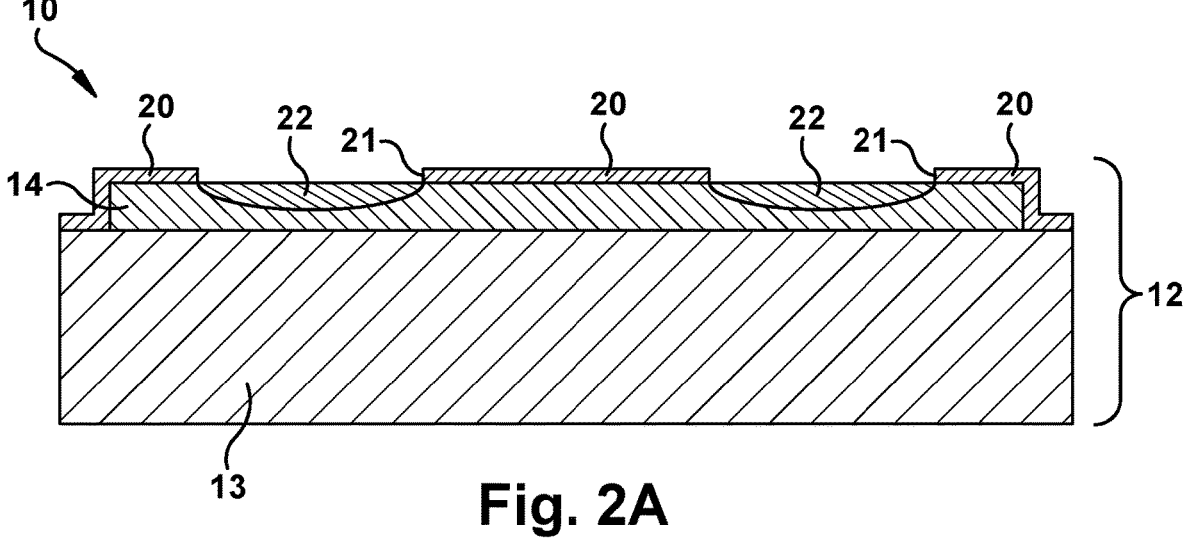
FIGS. 2A-2G are schematic cross-sectional views depicting exemplary process steps of forming an exemplary electrical device according to an embodiment.

Referring to FIG. 2A and step 112 in FIG. 1A, the step of providing the substrate 12 includes providing any suitable substrate for the electrical device 10 as may be desired for a particular application. In the illustrated embodiment, the substrate 12 supporting the dielectric layer 16 and interconnects 18 includes the photoconductor layer 14 and a lower substrate layer 13 to support the other layers. In exemplary embodiments, the photoconductor layer 14 is made with mercury cadmium telluride ($Hg_{1-x}Cd_xTe$) (also referred to as "MCT"). The lower substrate layer 13 may be any suitable substrate configured to support the other layers, such as a silicon substrate, for example.

The layers below the dielectric layer 16, which in combination are generally referred to herein simply as the substrate 12, may include additional layers (not shown) depending on the type of electrical device and fabrication method. For example, between the photoconductor layer 14 (e.g., MCT) and the lower substrate layer 13 (e.g., silicon), one or more buffer layers may be provided which may include cadmium and tellurium, and which may improve interfacial bonding of the MCT photoconductor layer 14 above. In addition, one or more passivation layers may be formed atop the photoconductor layer 14, which may include cadmium and tellurium, and which may improve the interfacial bonding between the MCT photoconductor layer 14 and adjacent dielectric layer 16.

Still referring to FIG. 2A, a cap layer 20 may be formed overlying the photoconductor layer 14. In exemplary embodiments, the cap layer 20 is made of CdTe, but could be $SiN_x$ or other suitable passivation layer. As shown, openings 21 are formed through at least the cap layer 18 to expose the photoconductor layer 14 below. Thereafter, implants 22 are formed in the photoconductor layer 14. The implants 22 provide a p-n junction with the photoconductor layer 14 to enable a photoelectric effect. For example, where the photoconductor layer 14 is an n-type material, then the implants 22 will be formed with a p-type material to form the p-n junction. Alternatively, if the photoconductor layer 14 is a p-type semiconductor, then the implant 22 will be an n-type implant. Accordingly, in the exemplary photodetector 10, an incident IR photon may pass through the lower substrate layer 13 (e.g., via a window) and interact with the p-n junction in the photoconductor layer 14 to generate a photoelectric current which is transmitted via the interconnects 18.

Figure 2B:
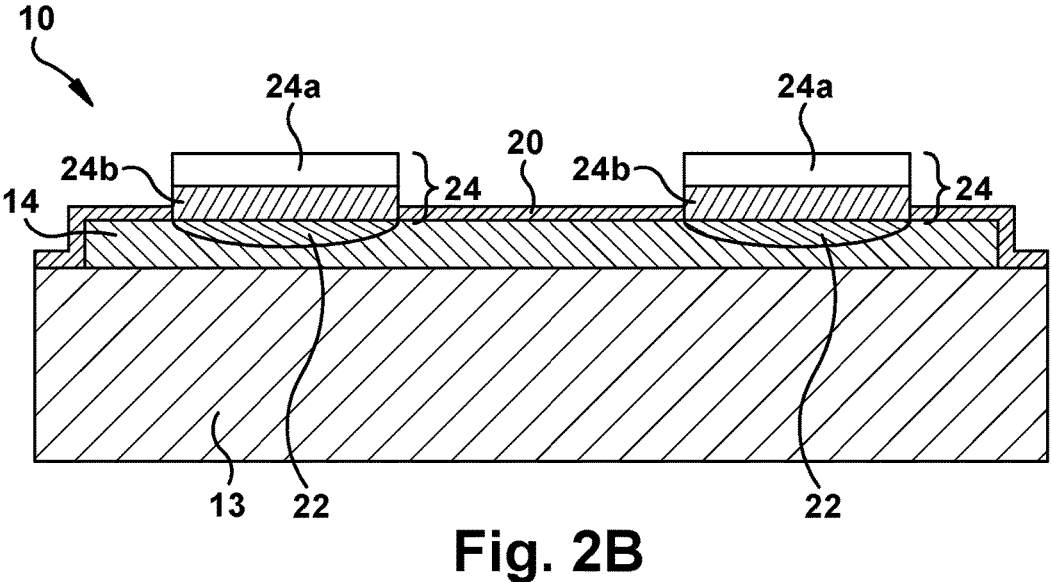

Turning to FIG. 2B, electrical contact pads 24 are formed in the openings 21 above the implants 22 to transfer electrons generated at the p-n junction in the photoconductor layer 14 to the interconnects 18. The contact pads 24 may be formed with any suitable technique, including deposition and patterning. As shown, the electrical conduct pads 24 may be formed to protrude above the upper surface of the cap layer 20. The contact pads 24 may be formed with any suitable electrically conductive material or combination of materials, including an electrically conductive metal. In exemplary embodiments, the contact pads 24 may include a metal layer 24a (e.g., aluminum) and a barrier layer 24b (e.g., TiW) underlying the metal layer 24a to prevent interdiffusion with the photoconductor layer 14.

Figure 2C:
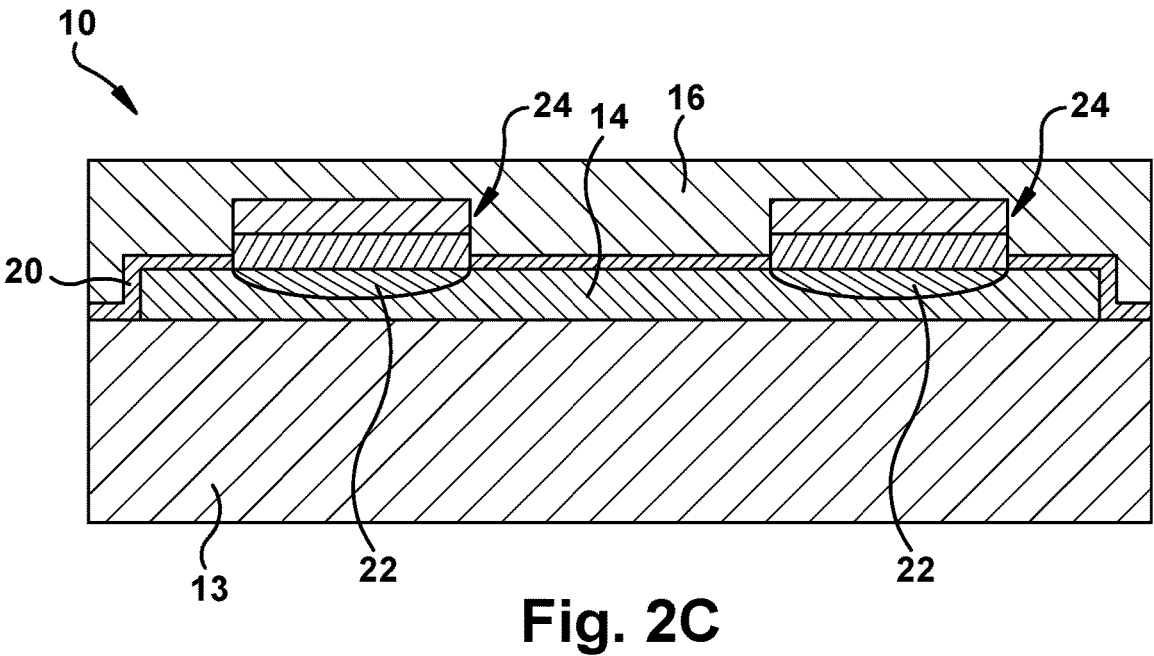

Referring to FIG. 2C and step 114 in FIG. 1A, the exemplary dielectric layer 16 is formed overlying at least a portion of the substrate 12. The dielectric layer 16 may be formed with any suitable material via any suitable technique as may be desired for the application. As shown, the dielectric layer 16 is applied to overlie at least the electrical contact pads 24 which protrude above the cap layer 20. In the illustrated embodiment, the dielectric layer 16 overlies an entirety of the lateral extent of the photoconductor layer 14 and surrounds the peripheral edges of the photoconductor layer 14; and more particularly the dielectric layer 16 may extend to the peripheral edges of the electrical device 10. The dielectric layer 16 may be any suitable thickness to provide the desired functionality of electrical insulation, rigidity/support, or the like. In the illustrated embodiment, for example, the dielectric layer may have a thickness in a range from 2 micrometers (microns) to 4 microns.

As discussed above and shown at step 114a in FIG. 1A, the dielectric layer 16 may be formed on the device 10 with a low-temperature process below the thermal degradation temperature of any temperature-sensitive materials contained in the electrical device 10. For example, a thermal degradation temperature of the temperature-sensitive MCT material in the photoconductor layer 14 is about 150° C., and thus the dielectric layer 16 is formed at a temperature below 150° C., such as in the range from about 25° C. to about 150° C. (e.g., 25° C., 50° C., 75° C., 85° C., 90° C., 100° C., 125° C., 140° C., or 150° C., including all ranges and subranges between the stated values). The low-temperature process for forming the dielectric layer may include a suitable deposition process, such as physical vapor deposition, for example, PVD reactive sputtering. Alternatively or additionally to MCT, other thermally-sensitive materials with different thermal degradation temperatures may be contained in the device 10 prior to formation of the dielectric layer 16, and thus a process temperature of the dielectric layer 16 preferably stays below the lowest degradation temperature of any such thermally-sensitive materials.

Also discussed above and shown at step 114b in FIG. 1A, the dielectric layer 16 may be formed on the device 10 as a low-stress layer. In particular, the dielectric layer 16 may be adapted via its processing parameters to provide a structure with a low intrinsic stress, such as a low tensile or compressive stress of the layer 16. In exemplary embodiments, the low-stress layer has an intrinsic in-plane biaxial stress, if any, that is configured to impart little to no stress on fragile material(s) within the device to prevent damage thereto. For example, the MCT material of the photoconductor layer 14 is a fragile material, having a low fracture toughness of about 0.20 MPa·m$^{1/2}$ K$_{IC}$, which is therefore easy to damage especially in tension. Accordingly, to mitigate detrimental effect to the MCT material during fabrication or operation of the device 10, the dielectric layer 16 may be configured to have an intrinsic stress value that imparts a stress (force) that is less than a failure stress value of the MCT layer.

Alternatively or additionally to MCT, other fragile materials may be contained in the device 10 during fabrication or operation, and thus an intrinsic stress value of the dielectric layer 16 that imparts a stress (force) to the fragile material(s) is preferably lower than the lowest failure stress value of any such materials. One way to determine a maximum in-plane biaxial stress value of the dielectric material 16 is to determine when the in-plane stress exceeds the threading dislocation glide force, in which dislocations glide to reconfigure to the lowest strain energy. By way of example, and not limitation, at room temperature (25° C.), a (111) oriented material on 60° mixed burger's vectors would occur at about 0.5 MPa (compressive or tensile). The glide will leave a misfit line at the base if the threading dislocation occurs, which could increase noise if in the active region. Threading dislocation formation for the same orientation and defect type occurs at about 3 MPa for 7 μm thick material. If the material already had dislocations, then the in-plane stress to relax to the lowest stress energy configuration would then form dislocations after an additional 3 MPa in-plane stress. Using such methodology as an example, one having ordinary skill in the art could determine that maximum in-plane biaxial stress of the dielectric layer 16 should not exceed 3.5 MPa. As such, the low-stress dielectric layer 16 may have an intrinsic in-plane biaxial stress that is in a range from 0.0 MPa to 3.5 MPa, for example.

Still referring to FIG. 2C and also to step 114c in FIG. 1A, the dielectric layer 16 may be applied to the electrical device 10 in such a way as to provide planarization that compensates for latent total thickness variation in portions of the device underlying the dielectric layer 16. Generally, such planarization involves increasing the flatness or planarity of the surface of the electrical device 10. For example, although the lower substrate 13 (e.g., silicon substrate) may be relatively flat or planer, as the device 10 goes through the various steps of fabrication, layers of different materials, shapes, and depths are deposited with different growth or deposition techniques, which leads to a decrease in the flatness or planarity of the device surface. MCT, for example, is a relatively soft material (e.g., Mohs hardness of about 4.0). Accordingly, in exemplary embodiments, the dielectric layer 16 is formed in such a way to provide planarization that reduces or eliminates latent total thickness variation in the device 10 up to that point. To facilitate such planarization, the dielectric layer 16 may be applied in the step shown in FIG. 2C with a suitable thickness to overlie all structures in the device 10 at that point, and thus provide an upper surface of the dielectric layer 16 that is planarized or flat.

One exemplary type of material for the dielectric layer 16 that achieves each of the foregoing functions of (i) low stress; (ii) low processing temperatures; and (iii) enhanced planarization is aluminum nitride (AlN$_x$, also referred to herein simply as AlN). Another exemplary type of material for the dielectric layer 16 that achieves each of the same functions is silicon nitride (SiN$_x$, also referred to herein simply as SiN). As understood by those having ordinary skill in the art, the specific processing conditions when forming the AlN or SiN may affect its microstructure and characteristic properties, such as low intrinsic stress. In exemplary embodiments, the AlN or SiN is formed during a low-temperature (e.g., less than 150° C.) sputtering process (such as reactive sputtering), which can form the material with an increased degree of polycrystallinity in its microstructure. It is understood that other suitable dielectric materials (or combination of materials) made by one or more other suitable techniques may be utilized in the dielectric layer 14 depending on the desired characteristics in the electrical device and cooperation with other materials in the device 10.

Figure 2D:
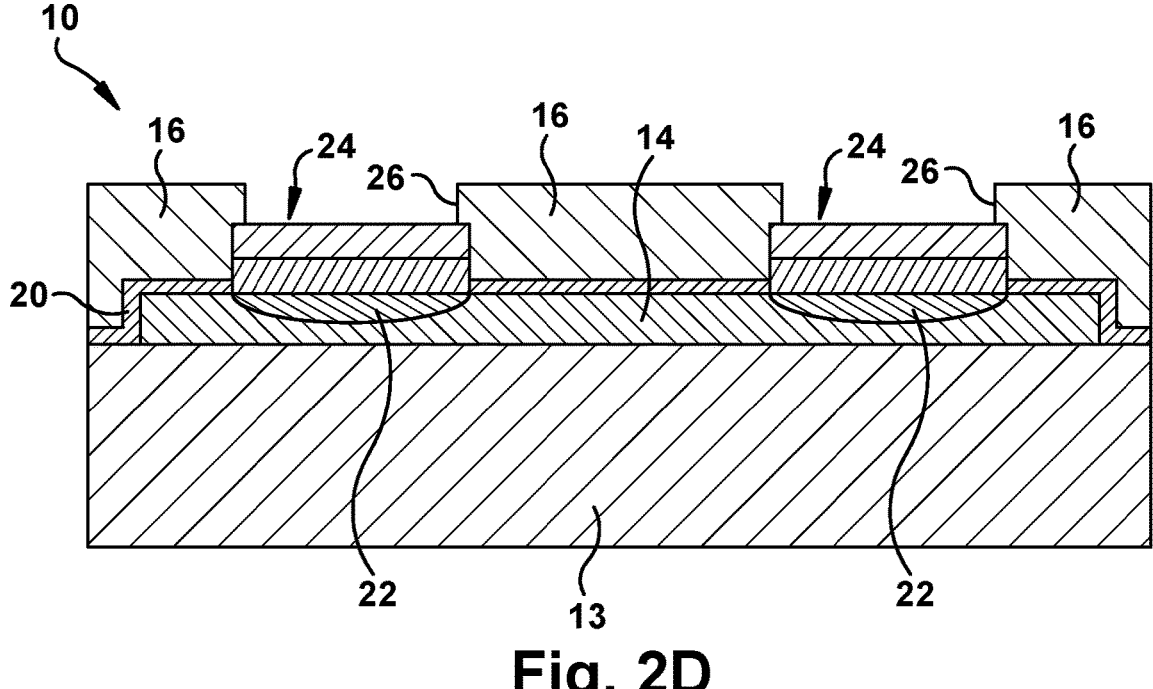

Turning to FIG. 2D, after forming the dielectric layer 16, one or more via holes 26 are formed in the dielectric layer 16 to correspond with the locations of the contact pads 24. The formation of the via holes 26 may be made by any suitable technique, such as pattern and etching. As shown, following formation of the via holes 26, the dielectric layer 16 is still at an elevation above the upper surfaces of the contact pads 24.

Figure 2E:
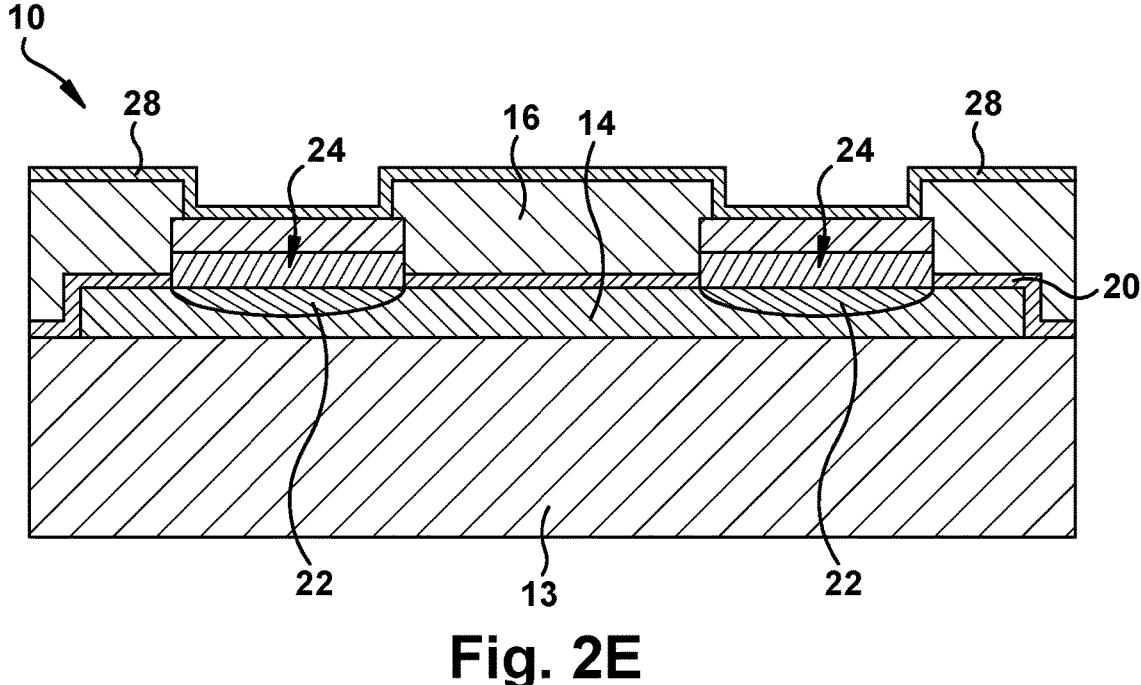

FIG. 2E shows depositing a base layer 28. In the illustrated embodiment, the base layer 28 overlies the upper surfaces and respective sides of the via holes of the dielectric layer 16, and overlies the respective upper surfaces of the electrical contact pads 24. The base layer 28 may be made of a suitable metal that facilitates electrochemical plating the material that forms the vertical interconnects 18 (shown in FIG. 2F and described below). In the illustrated embodiment, for example, the base layer 28 is made of tin (Sn) and is deposited by a PVD process.

Figure 2F:
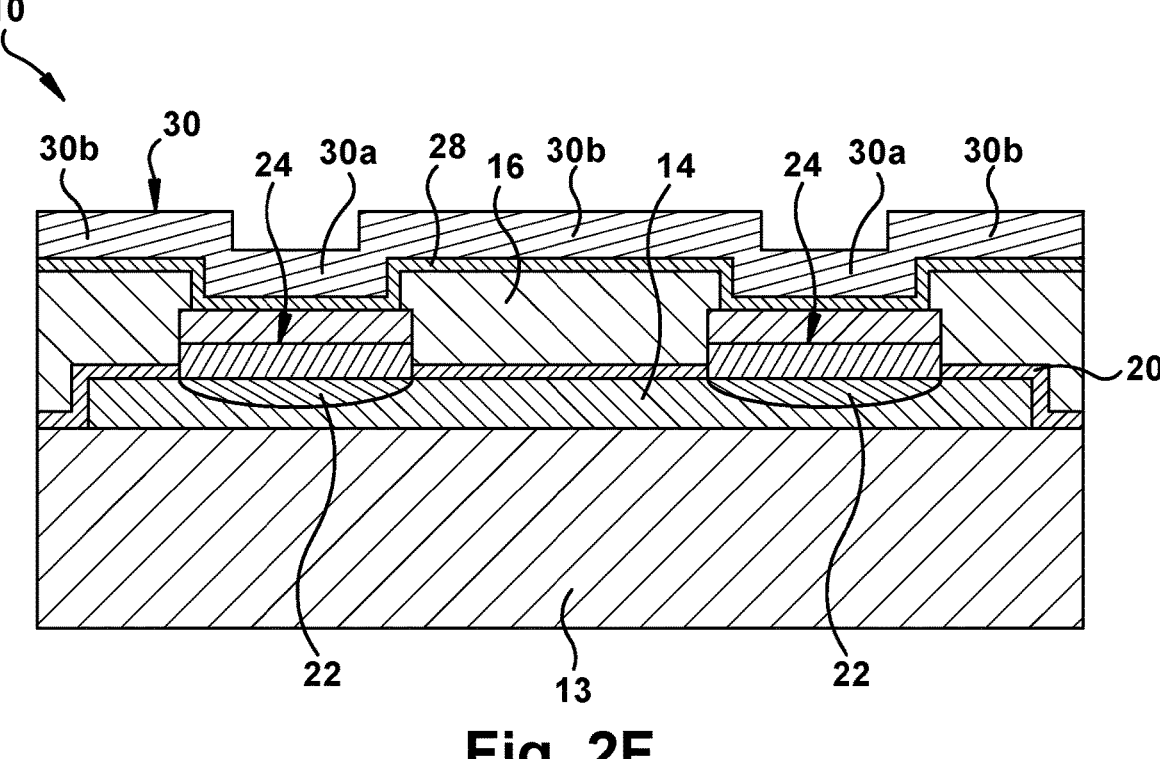

Referring to FIG. 2F and step 116 in FIG. 1B, the material forming the vertical interconnects 18 is applied to the electrical device 10. The interconnect material may be made of any suitable electrically conductive material that made with any suitable processing technique. In the illustrated embodiment, the interconnect material is formed as a conductive layer 30 that is deposited via an electrochemical plating process to overlie the upper surfaces of the device 10. The plating process may provide a relatively thick layer in a relatively short duration at relatively low temperatures. As shown, the thickness of the conductive layer 30 is such that the remainder of the via hole 26 is filled with the interconnect material (shown at 30a), and overburdened areas 30b are formed outside of the via holes 26. Although plating may be one suitable technique, it is understood that the method of forming the interconnects 18 could be any suitable deposition process, such as an evaporation, sputtering, or chemical vapor process (e.g., e-Beam, PVD, or CVD, for example). In such alternate processes, the base layer 28 (e.g., tin layer) may not be needed. Generally, the processing steps for forming the conductive layer 30 may be performed at a temperature less than a thermal degradation temperature of any thermally-sensitive materials in the device 10.

As discussed above and shown at step 116a in FIG. 1B, the material forming the interconnects 18 may have a coefficient of thermal expansion (CTE) that is greater than a coefficient of thermal expansion of the dielectric layer 16. This may enable the fully-formed interconnect structures 18 (as shown in FIG. 2G) to facilitate 3D-integration with another electrical device 50 (as shown in FIG. 3A) by forming compressive stresses at the interfaces between interconnects 18, 52 in each device 10, 50 during an elevated temperature bonding step due to the CTE mismatch between the interconnects 18 and surrounding dielectric layer 16.

Also discussed above and shown at step 116b in FIG. 1B, the material forming the interconnects 18 of the electrical device 10 may be diffusion bondable with the opposing interconnect 52 of the second device 50 at a temperature that is less than a thermal degradation temperature of thermally-sensitive materials in the electrical device 10. As noted above, a thermal degradation temperature of the temperature-sensitive MCT material in the photoconductor layer 14 is about 150° C., and thus the interconnects 18, 52 may be diffusion bondable at a temperature of about 150° C. or lower. Alternatively or additionally to MCT, other thermally-sensitive materials with different thermal degradation temperatures may be contained in the device 10, and thus a diffusion bonding temperature of the interconnect material may be about the same temperature or lower than the lowest degradation temperature of any such thermally-sensitive materials.

One exemplary type of material for the interconnects 18, which is formed as the conductive layer 30 in FIG. 2F, and which satisfies each of the foregoing functions of (i) being electrically conductive, (ii) having a CTE that is greater than a CTE of the dielectric layer 16, and (ii) is diffusion bondable at temperatures lower than a degradation temperature of thermally-sensitive materials such as MCT, is indium (In). It is understood, however, that other suitable materials may be employed depending on the desired characteristics and cooperation with other materials in the device 10.

Figure 2G:
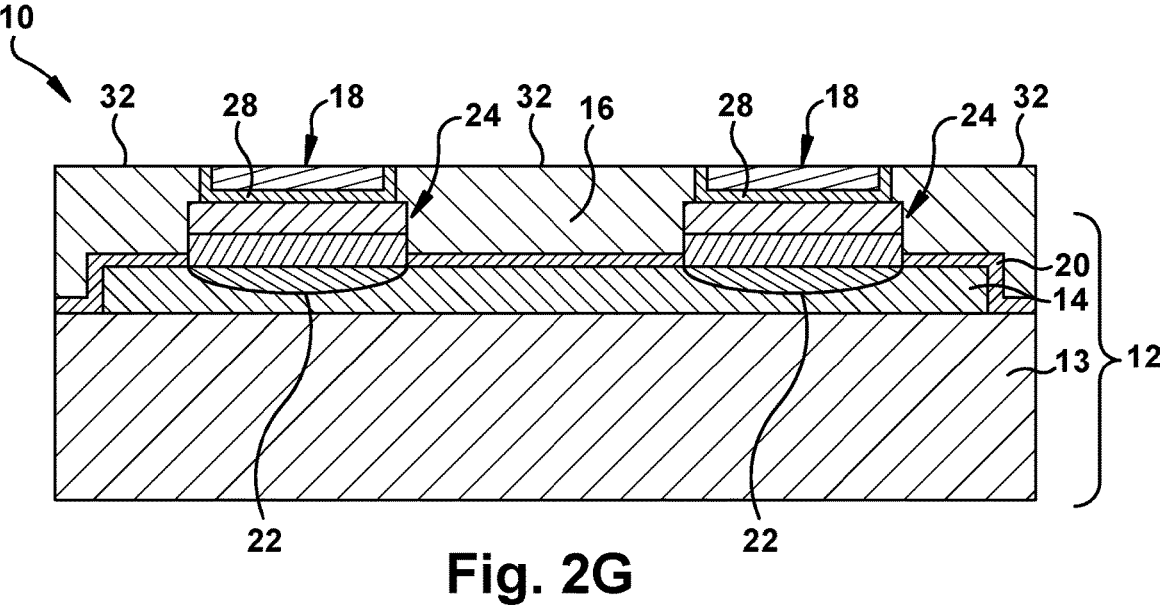
Figure 3A:
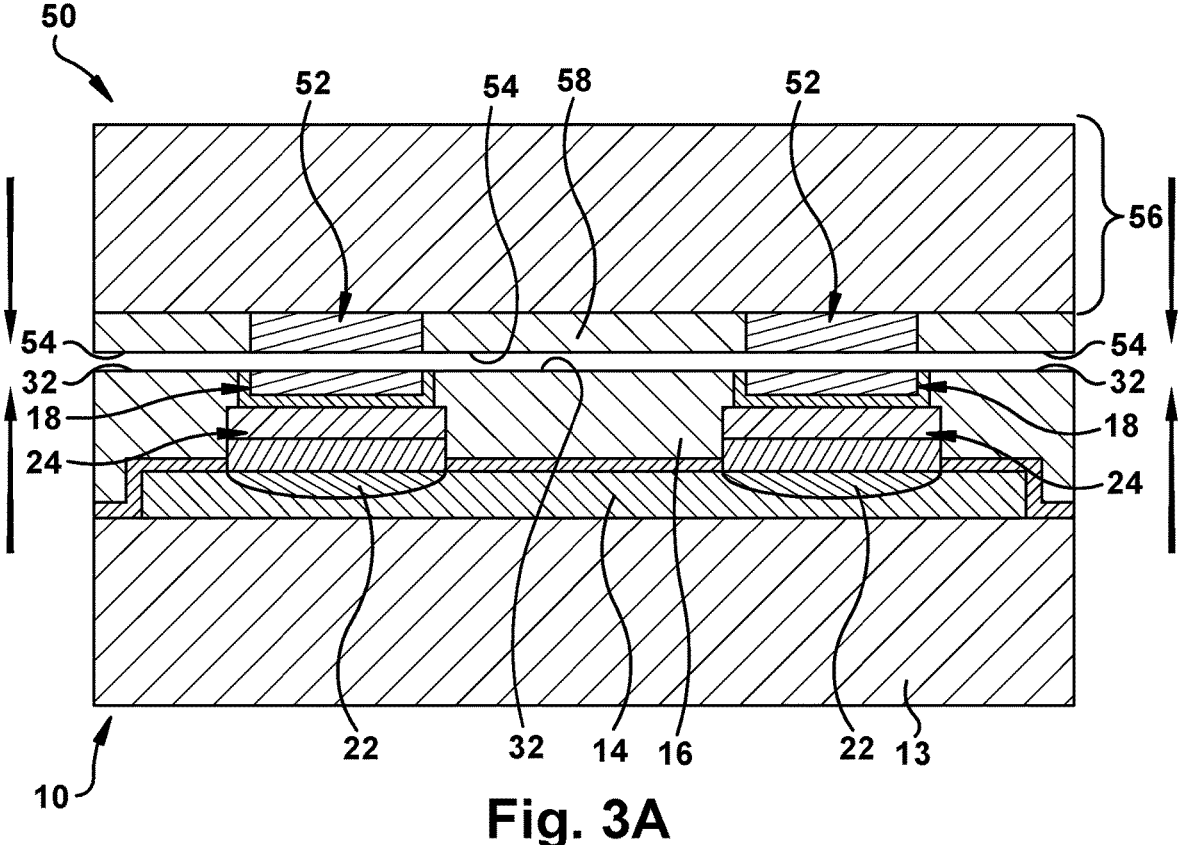
FIGS. 3A and 3B are schematic cross-sectional views depicting an exemplary process of 3D-integrating the exemplary electrical device in FIG. 2G to another exemplary electrical device.

Referring to FIG. 2G and step 118 in FIG. 1B, a step of preparing the electrical device for 3D-integration with another electrical device is shown. This process may include chemical mechanical polishing (CMP) to remove the overburden portions 30*b* of the conductive layer in the previous step, along with the overburden portions of the plating base layer 28 if applicable. As shown, this results in the electrically conductive material (e.g., indium) disposed in the via holes of the dielectric layer 16 to form the respective vertical interconnect structures 18. In exemplary embodiments, the respective vertical interconnects 18 have a majority, and more particularly an entirety, of their axial extent surrounded by the dielectric layer 16. The dielectric layer 16 also surrounds a majority of the electrical contact pads 24. The CMP process also results in a substantially planar upper surface of the electrical device 10 in which the upper surfaces of the respective interconnects 18 are on the same horizontal plane as the upper surface of the dielectric layer 16, although there may be some dishing of the interconnects 18 by virtue of the CMP process.

In exemplary embodiments, the preparation of the electrical device 10 for 3D-integration also may include applying a bonding layer at the upper surfaces of the dielectric layer 16. The bonding layer is depicted at positions 32 in the illustrated embodiment. The bonding layer may be a conformal dielectric film. The bonding layer provides interfacial bonding with an opposing bonding layer (shown at positions 54) of the second electrical device 50. The bonding may include ambient room temperature bonding by Van der Waals forces between the bonding layers, and which may be further promoted by covalent fusion bonding at elevated temperatures. The bonding layer may be a non-metallic material, such as an oxide, more particularly a silicon oxide ($SiO_x$), for example silicon dioxide (e.g., fused silica or $SiO_2$). The bonding layer may be formed at any suitable step during the method 100 by any suitable technique, such as a deposition process, including physical vapor deposition, reactive physical vapor deposition, chemical vapor deposition, plasma enhanced chemical vapor deposition, sputtering, or a spin-on glass process.

FIG. 3A and method 200 in FIG. 1B illustrate the start of 3D-integration of the first electrical device 10 (e.g., photodetector 10) with the second electrical device 50. In the illustrated embodiment, the second electrical device 50 is a read-out integrated circuit (ROIC), which may have several of the same or similar features as the first electrical device 10, including a substrate 56, a dielectric layer 58 supported by the substrate 56, and one or more electrically conductive vertical interconnects 52 corresponding with the interconnects 18 in the first electrical device 10. The substrate 56 may include the ROIC circuitry and electrical contacts for receiving electrons from the photodetector 10 via the interconnect structures 18, 52. The dielectric layer 58 may be the same as dielectric layer 16, including formation at low-temperatures, having low-stress (low intrinsic stress value), and/or offering planarization during processing of the ROIC 50. In addition, the interconnects 52 may be the same as the interconnects 18 to provide compatibility for diffusion bonding together. As such, the interconnects 52 may have a greater CTE than the dielectric layer 58 to facilitate 3D-integration, and the material of the interconnects 52 may be diffusion bondable at low temperatures as well. As noted above, a bonding layer (shown at positions 54) may be applied to the second electrical device 50, which may be the same as the bonding layer (shown at positions 32) of the first electrical device 10 to provide compatible bonding together.

Still referring to FIG. 3A, the 3D-integration process includes contacting the first electrical device 10 (e.g., photodetector) with the second electrical device 50 (e.g., ROIC), which may occur at standard ambient temperature (i.e., 25° C. according to IUPAC standard). During this step, an initial bond may occur by contacting the exposed interfaces of the bonding layers (e.g., $SiO_x$) together to form a Van der Waals bond. In this step, the respective interconnects 18 and 52 are aligned with each other and may contact each other. By virtue of the CMP process, the respective interconnects 18, 52 may have some dishing, and thus a small gap may exist between the interconnects 18 and 52.

Figure 3B:
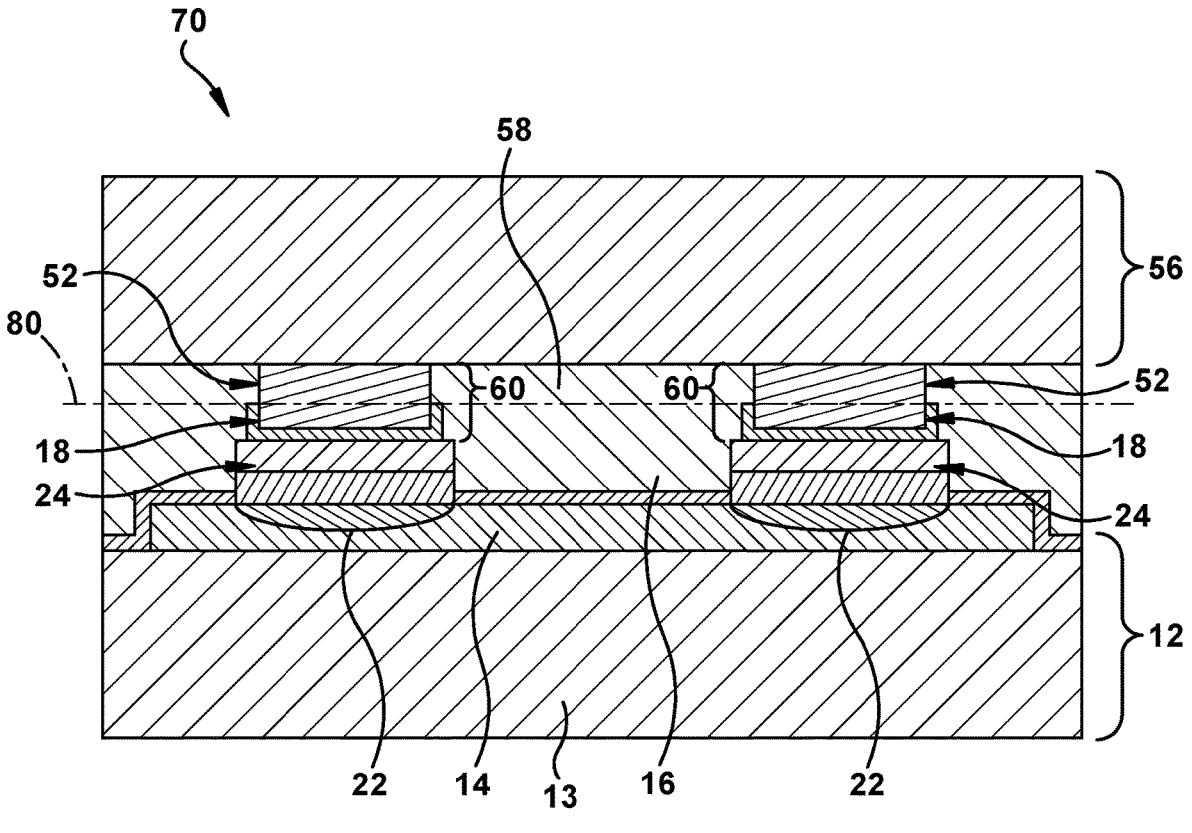

Turning to FIG. 3B and referring to step 210 in FIG. 1B, 3D-integration of the first device 10 and second device 50 is shown by elevated temperature bonding of the devices 10, 50 together to form a 3D-integrated electrical device 70. As noted above, by virtue of the CTE mismatch of the interconnects 18, 52 relative to their respective surrounding dielectric layers 16, 58, during the elevated temperature process the interconnects 18, 52 will expand more than their surrounding dielectric layers 16, 58, making compressive contact at the interfaces (shown by dashed line 80) of the respective interconnects 18, 52. This compressive contact enables closing the gap between interconnects 18, 52 that may have been caused by dishing. At the elevated temperature process, the respective bonding layers (e.g., $SiO_x$) covalently bond together, and the interconnects 18, 52 fuse together into respective single integrated conductive posts 60 that extend through the integrated bonding layer.

As discussed above, the interconnects 18, 52 preferably are made of a material that enables diffusion bonding at a temperature that is about equal to or less than a thermal degradation temperature of the thermally-sensitive material(s) in the device 10. For example, MCT has a thermal degradation temperature of about 150° C. and indium is diffusion bondable with itself at about 150° C. In exemplary embodiments using MCT, for example, the diffusion bonding of the interconnect structures 18, 52 occurs at a temperature in the range from 140° C. to less than 150° C., but could be greater after the AlN layer is deposited by virtue of its encapsulation of the MCT. It is understood, however, that there may be some overlap in the thermal degradation temperature and diffusion bonding temperature that would not significantly affect the functionality of either the thermally-sensitive material (e.g., MCT) or interconnects (e.g., In). For example, the elevated temperature bonding may occur at a temperature of about 160° C. without significantly degrading the MCT.

While an exemplary form of the exemplary electrical device 10 and/or 3D-integrated electrical device 70 have been described above, it is understood that alternative configurations also could be employed according to the principles and aspects described herein.

For example, although reference is made predominantly to MCT as the fragile material, it is understood that other fragile materials may be used at other regions in electrical devices, in which it may be desirable to provide a low-stress dielectric layer 16 that imparts little to no stress on the fragile material(s). Generally, the low-stress layer may have an intrinsic in-plane biaxial stress level in a range from about −10.0 MPa to about +10.0 MPa. The acceptable level of stress for the low-stress dielectric layer may be relative to the amount of stress (force) the dielectric layer imparts on the fragile material(s). Accordingly, as used herein the term "low-stress" means exhibiting a stress value that imparts a stress (force) that is less than a failure stress value of the fragile material. Generally, a "fragile material" is one having a $K_{IC}$ fracture toughness of less than 1 MPa·m$^{1/2}$. The "failure stress value" as used herein is commonly referred to as a "strength" of the material, which may include the yield strength, ultimate strength, rupture strength, fracture toughness, or the like, at which the underlying functionality of the material (e.g., mechanical and/or electrical properties) appreciably deteriorates or fails to perform. As discussed above, at least one method of determining the intrinsic stress value of the dielectric material 16 is to determine when the in-plane stress of the material exceeds the threading dislocation glide force.

Also, although reference is made predominantly to MCT as the thermally-sensitive material, it is understood that other thermally-sensitive materials may be used at other regions in electrical devices, in which it may be desirable to provide a dielectric layer 16 that can be formed at low-temperature. Generally, the low-temperature formation of the dielectric layer 16 may be performed at a temperature in a range from about 75° C. to about 150° C., more particularly 90° C. to 125° C., and more particularly about 100° C. The acceptable temperature for processing the dielectric layer 16 may be relative to the thermal degradation temperature of the thermally-sensitive material(s). Accordingly, as used herein the term "low-temperature" means a temperature value that is about equal to or less than a thermal degradation temperature of the thermally-sensitive material. As used herein, the term "thermal degradation temperature" means the temperature at which the action of heat on a material causes a loss of properties such as physical, mechanical, and electrical properties. Such loss of properties by thermal degradation may be manifested by microstructural or compositional changes, time-dependent deformation and resultant damage accumulation, environmental attack and accelerating reactionary effects with the environment at elevated temperature, or the like. For example, the thermal degradation temperature may include a temperature at which thermal decomposition occurs, where a substance chemically decomposes (breaking of chemical bonds) into one or more constituent parts. The thermal decomposition temperature also may include the melting temperature, glass transition temperature, eutectic formation temperature, boiling/volatilization temperature, or the like for such materials.

By way of non-limiting example, some exemplary temperature-sensitive materials used in electrical devices, and their thermal degradation temperature, include the following: lead-tin (PbSn) having a eutectic melting temperature of 183° C.; bismuth lead tin (BiPbSn) having a melting temperature of about 95° C.); bismuth tin (BiSn) having a eutectic melting temperature of about 138° C.; indium tin (52% In: 48% Sn) having a melting temperature of about 118° C.; indium (In) having a melting point of about 155° C.; tin (Sn) having a melting point of about 230° C.; rubidium (Rb) having a melting point of about 40° C.; cadmium telluride (CdTe) or cadmium zinc telluride (CdZnTe) having a thermal degradation temperature of about 180° C.; mercury cadmium telluride (Hg$_{1-x}$Cd$_x$Te) having a thermal degradation temperature of about 150° C. As such, a thermal degradation temperature of a thermally-sensitive material according to the present disclosure may be in a range from 50° C. to 250° C. As noted above, it may be beneficial if each processing step performed on the electrical device containing the thermally-sensitive material at that step is kept about equal to or below the thermal degradation temperature of the thermally-sensitive material.

An exemplary electrical device has been described herein that includes a substrate, a dielectric layer supported by the substrate, and an electrically conductive vertical interconnect extending through the dielectric layer. The dielectric layer may be formed at low-temperature below the thermal degradation temperature of thermally-sensitive material in the device. The dielectric layer may be a low-stress layer that imparts no stress or less stress than a failure stress of fragile material in the device. The dielectric layer may be formed during a processing step to planarize the electrical device at that step. The vertical interconnect may be diffusion bondable with another opposing interconnect at a low-temperature below the thermal degradation temperature of thermally-sensitive material in the device. The vertical interconnect may have a coefficient of thermal expansion (CTE) that is greater than a CTE of the dielectric layer to facilitate 3D-integration.

According to more particular embodiment(s), the electrical device is a photodetector that provides a low-temperature dielectric layer which is low-stress, low fixed charge, and adheres well to an MCT layer (or passivation layers thereabove) that are deposited prior to a bonding dielectric layer. Oxide-oxide bonding can then be accommodated to the ROIC bonding layer. The dielectric layer may be AlN or SiN dielectric which is low-stress and bonds effectively to both the MCT and SiO$_x$ bonding layer. The architecture of the electrical device has a flat surface topology allowing the photodetector array to be contiguously bonded to the ROIC. Metal through-via interconnects in the ROIC layer bonds with the photodetector by heating the composite structure at temperatures less than 150° C. The high thermal coefficient of expansion of the metal interconnects relative to the surrounding dielectric extends the metal into the opposing metal interconnect forming a seamless integral electrical interconnect structure.

It is understood that all ranges and ratio limits disclosed in the specification and claims may be combined in any manner, including all values, ranges and subranges between the stated values. The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values.

As used herein, positional or direction terms such as "upper", "lower", "top", "bottom," "left," "right," "horizontal," "vertical," etc. refer to an exemplary electrical device as viewed in a horizontal position, as shown in FIG. 2G, for example. This is done realizing that these devices can be oriented in various other positions when manufactured, when implemented in other electrical devices, when packaged, and the like.

As used herein, the terms "disposed on," "disposed onto," "deposited onto," "underlying," "overlying," or the like, refers to direct or indirect contact of one element with another element, whereas the term "directly on" or "directly onto" refers to direct contact of one element with another element, but not indirect contact between elements.

It is to be understood that unless specifically stated otherwise, references to "a," "an," and/or "the" may include one or more than one, and that reference to an item in the singular may also include the item in the plural. The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

The word "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," may refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The transitional words or phrases, such as "comprising," "including," "carrying," "having," "containing," "involving," "holding," "made of/with," and the like, are to be understood to be open-ended, i.e., to mean including but not limited to, unless otherwise stated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical device comprising:
a substrate;
a low-stress dielectric layer having a first side and a second side, the low-stress dielectric layer supported by the substrate, wherein the low-stress dielectric layer has a via hole;
an electrically conductive vertical interconnect disposed in the via hole, the electrically conductive vertical interconnect extending towards the second side of the low-stress dielectric layer; and
a fragile material disposed under the second side of the low-stress dielectric layer;
wherein the electrically conductive vertical interconnect is diffusion bonded to another opposing interconnect at a temperature of 150° C. or less;
wherein an upper surface of the electrical device is substantially planar along a plane and includes an upper surface of the electrically conductive vertical interconnect and an upper surface of the low-stress dielectric layer separated by a base layer along the plane;
wherein, prior to diffusion bonding of the electrically conductive vertical interconnect to the other opposing interconnect, the electrically conductive vertical interconnect has a dished surface creating a gap between the electrically conductive vertical interconnect and the other opposing interconnect;
wherein the gap between the electrically conductive vertical interconnect and the other opposing interconnect is closed as a result of the electrically conductive vertical interconnect expanding to fill the gap during diffusion bonding;
wherein the electrically conductive vertical interconnect has a coefficient of thermal expansion that is greater than a coefficient of thermal expansion of the low-stress dielectric layer; and
wherein any stress imparted to the fragile material by the low-stress dielectric layer during diffusion bonding is less than a failure stress of the fragile material.

2. The electrical device according to claim 1, wherein the low-stress dielectric layer is depositable at a temperature in a range from 25° C. to 150° C.

3. The electrical device according to claim 1, wherein the low-stress dielectric layer surrounds a majority of an axial extent of the electrically conductive vertical interconnect.

4. The electrical device according to claim 1, wherein the low-stress dielectric layer is aluminum nitride ($AlN_x$).

5. The electrical device according to claim 1, wherein the low-stress dielectric layer is silicon nitride ($SiN_x$).

6. The electrical device according to claim 1, wherein the electrically conductive vertical interconnect is made of indium.

7. The electrical device according to claim 1, wherein the fragile material has a $K_{IC}$ fracture toughness less than 1.0 $MPa \cdot m^{1/2}$.

8. The electrical device according to claim 1, further comprising a temperature-sensitive material having a thermal degradation temperature in a range from 100° C. to 250° C.

9. The electrical device according to claim 8, wherein the temperature-sensitive material is $Hg_{1-x}Cd_xTe$ having a thermal degradation temperature of 150° C.

10. The electrical device according to claim 9, wherein the electrical device is a photoconductor.

11. The electrical device of claim 1, wherein the first side of the low-stress dielectric layer faces away from the substrate;

wherein the first side of the low-stress dielectric layer surrounds the via hole and the electrically conductive vertical interconnect; and wherein at least part of the via hole is along the plane with the upper surface of the electrically conductive vertical interconnect and the upper surface of the low-stress dielectric layer.

12. A three-dimensional (3D)-integrated electrical device comprising:

a first electrical device; and a second electrical device comprising a read out integrated circuit;

wherein the first electrical device is bonded and electrically integrated to the second electrical device; and wherein the first electrical device comprises:

a substrate;

a low-stress dielectric layer having a first side and a second side, the low-stress dielectric layer supported by the substrate, wherein the low-stress dielectric layer has a via hole, and wherein the first side of the low-stress dielectric layer faces away from the substrate;

an electrically conductive vertical interconnect disposed in the via hole, the electrically conductive vertical interconnect extending towards the second side of the low-stress dielectric layer; and a fragile material disposed under the second side of the low-stress dielectric layer;

wherein the electrically conductive vertical interconnect is diffusion bonded to another opposing interconnect at a temperature of 150° C. or less;

wherein an upper surface of the first electrical device is substantially planar along a plane and includes an upper surface of the electrically conductive vertical interconnect and an upper surface of the low-stress dielectric layer separated by a base layer along the plane;

wherein, prior to diffusion bonding of the electrically conductive vertical interconnect to the other opposing interconnect, the electrically conductive vertical interconnect has a dished surface creating a gap between the electrically conductive vertical interconnect and the other opposing interconnect;

wherein the gap between the electrically conductive vertical interconnect and the other opposing interconnect is closed as a result of the electrically conductive vertical interconnect expanding to fill the gap during diffusion bonding;

wherein the electrically conductive vertical interconnect has a coefficient of thermal expansion that is greater than a coefficient of thermal expansion of the low-stress dielectric layer; and wherein any stress imparted to the fragile material by the low-stress dielectric layer during diffusion bonding is less than a failure stress of the fragile material.

13. The 3D-integrated electrical device according to claim 12, wherein the fragile material has a $K_{IC}$ fracture toughness less than 1.0 MPa·m$^{1/2}$.

14. The 3D-integrated electrical device according to claim 12, wherein the first electrical device further comprises a temperature-sensitive material having a thermal degradation temperature in a range from 100° C. to 250° C.

15. The 3D-integrated electrical device according to claim 14, wherein the temperature-sensitive material is $Hg_{1-x}Cd_x Te$ having a thermal degradation temperature of 150° C.

16. A method of fabricating an electrical device, comprising:

forming a fragile material over at least a portion of a substrate;

forming a low-stress dielectric layer having a first side and a second side, the low-stress dielectric layer overlying at least a portion of the fragile material, wherein the first side of the low-stress dielectric layer faces away from the substrate;

forming a via hole in the low-stress dielectric layer; and forming an electrically conductive vertical interconnect in the via hole, the electrically conductive vertical interconnect extending towards the second side of the low-stress dielectric layer;

wherein the electrically conductive vertical interconnect is diffusion bonded to another opposing interconnect at a temperature of 150° C. or less;

wherein an upper surface of the electrical device is substantially planar along a plane and includes an upper surface of the electrically conductive vertical interconnect and an upper surface of the low-stress dielectric layer separated by a base layer along the plane;

wherein, prior to diffusion bonding of the electrically conductive vertical interconnect to the other opposing interconnect, the electrically conductive vertical interconnect has a dished surface creating a gap between the electrically conductive vertical interconnect and the other opposing interconnect;

wherein the gap between the electrically conductive vertical interconnect and the other opposing interconnect is closed as a result of the electrically conductive vertical interconnect expanding to fill the gap during diffusion bonding;

wherein the electrically conductive vertical interconnect has a coefficient of thermal expansion that is greater than a coefficient of thermal expansion of the low-stress dielectric layer; and wherein any stress imparted to the fragile material by the low-stress dielectric layer during diffusion bonding is less than a failure stress of the fragile material.

17. The method according to claim 16, wherein the low-stress dielectric layer surrounds a majority of an axial extent of the electrically conductive vertical interconnect.

18. The method according to claim 16, wherein:

at a time of forming the low-stress dielectric layer, the electrical device includes a thermally-sensitive material having a thermal degradation temperature in a range from 100° C. to 200° C.; and the low-stress dielectric layer is formed at a temperature equal to or less than the thermal degradation temperature of the thermally-sensitive material.

19. The method according to claim 18, wherein the fragile material has a $K_{IC}$ fracture toughness less than 1.0 MPa·m$^{1/2}$.

20. The method according to claim 18, wherein:

the thermally-sensitive material is $Hg_{1-x}Cd_x Te$;

the low-stress dielectric layer is aluminum nitride ($AlN_x$) or silicon nitride ($SiN_x$); and the electrically conductive vertical interconnect is indium.

* * * * *